US005281777A

United States Patent [19]

Alton, Jr.

[11] Patent Number: 5,281,777

[45] Date of Patent: Jan. 25, 1994

[54] FLUID DAMPED ACOUSTIC ENCLOSURE SYSTEM

[76] Inventor: Noyal J. Alton, Jr., 809 Timberlake Dr., Virginia Beach, Va. 23464

[21] Appl. No.: 25,142

[22] Filed: Mar. 2, 1993

[51] Int. Cl.$^5$ ............ H05K 5/00

[52] U.S. Cl. ............ 181/151; 181/156

[58] Field of Search ............ 181/145, 146, 151, 155, 181/156, 199, 166; 381/165, 188

[56] References Cited

U.S. PATENT DOCUMENTS 4,004,094 1/1977 Ott .

4,101,736 7/1978 Czerwinski ............ 181/151

4,356,882 11/1982 Allen ............ 181/151

4,944,019 7/1990 Watanabe ............ 181/14 F X 5,073,937 12/1991 Almasy .

*Primary Examiner*—Michael L. Gellner

*Assistant Examiner*—Khanh Dang

*Attorney, Agent, or Firm*—Peter J. Van Bergen

[57] ABSTRACT

A fluid damped acoustic enclosure system for a loudspeaker is provided. An enclosure defines first and second chambers separated by a common wall in which the loudspeaker is sealably mounted. The first chamber is airtight and the second chamber has a port in a wall thereof communicating with the exterior of the enclosure. A flexible bladder is filled with a fluid and maintained in the first chamber a given distance from the loudspeaker. The bladder receives acoustic pressure waves generated by the loudspeaker. The bladder is further mechanically coupled to a portion of at least one wall of the first chamber that communicates with the exterior of the enclosure.

41 Claims, 2 Drawing Sheets

FLUID DAMPED ACOUSTIC ENCLOSURE SYSTEM

FIELD OF THE INVENTION

The invention relates generally to loudspeaker enclosures, and more particularly to a fluid damped acoustic enclosure system.

BACKGROUND OF THE INVENTION

A loudspeaker vibrating in isolation produces very little sound. The reason for this is that the waves formed in the front and back of the loudspeaker can effectively cancel each other out. When the loudspeaker's cone is thrust forward, a high-pressure compression is formed in the front and a low-pressure rarefaction is formed in the back of the cone. If the wavelength of the sound is large compared to the dimensions of the loudspeaker, an air flow will be set up between the high-pressure and low-pressure regions with the result that the sound intensity is substantially reduced.

To prevent such reduction in sound intensity, a loudspeaker may be mounted in a baffle. The baffle prevents the air in front from communicating with the air in back of the speaker. A baffle is effective as long as the resulting path length between the front and back of the speaker is greater than the wavelength of the sound. In other words, the time required for a disturbance to travel from the front to the back must be greater than one period of the cone's motion.

Loudspeakers, however, are not normally mounted in baffles. Typically, loudspeakers are mounted in an enclosure. While such an arrangement prevents the transport of air from the front to the back of the loudspeaker, other problems arise that are related to low frequency audio reproduction. With respect to low frequency audio (1–150 Hertz), the human ear cannot generally detect audio signals below approximately 20 Hz. Yet, the vibrating sensations felt by audio signals below 20 Hz that are typically present during a live performance enhance the listening experience. However, even the best low frequency speaker systems, or sub-woofers as they are known, are only able to efficiently reproduce low frequency signals down to about 15 Hz and generally require a great deal of power to do so.

SUMMARY OF THE INVENTION

Accordingly, it is an object of the present invention to provide an acoustic speaker system that efficiently reproduces low frequency audio signals.

Another object of the present invention is to provide an acoustic speaker system whose low frequency or bass response closely simulates that of actual instrumental tones.

Still another object of the present invention is to provide an acoustic speaker system that efficiently reproduces audio signals below 15 Hz.

Other objects and advantages of the present invention will become more obvious hereinafter in the specification and drawings.

In accordance with the present invention, an acoustic enclosure system for a loudspeaker is provided. An enclosure defines a first chamber on top of a second chamber. The first and second chambers are separated by a common horizontal wall in which the loudspeaker is sealably mounted. The first chamber is airtight and the second chamber has a port in a wall thereof that is open to the exterior of the enclosure. A flexible bladder is filled with a fluid and is maintained in the first chamber at a given distance above the loudspeaker. The flexible bladder receives acoustic pressure waves generated by the loudspeaker. The bladder is mechanically coupled to a portion of at least one wall (e.g., the top wall) of the first chamber that communicates with the exterior of the enclosure. A flexible support is provided underneath the bladder. The flexible support horizontally divides the first chamber into a third chamber sharing a common top wall with the first chamber and a fourth chamber located between the common horizontal wall and the flexible support.

BRIEF DESCRIPTION OF THE DRAWINGS

FIG. 1(*b*) is a schematic view of an alternative embodiment of the acoustic enclosure system of the present invention;

DETAILED DESCRIPTION OF THE INVENTION

Figure 1A:
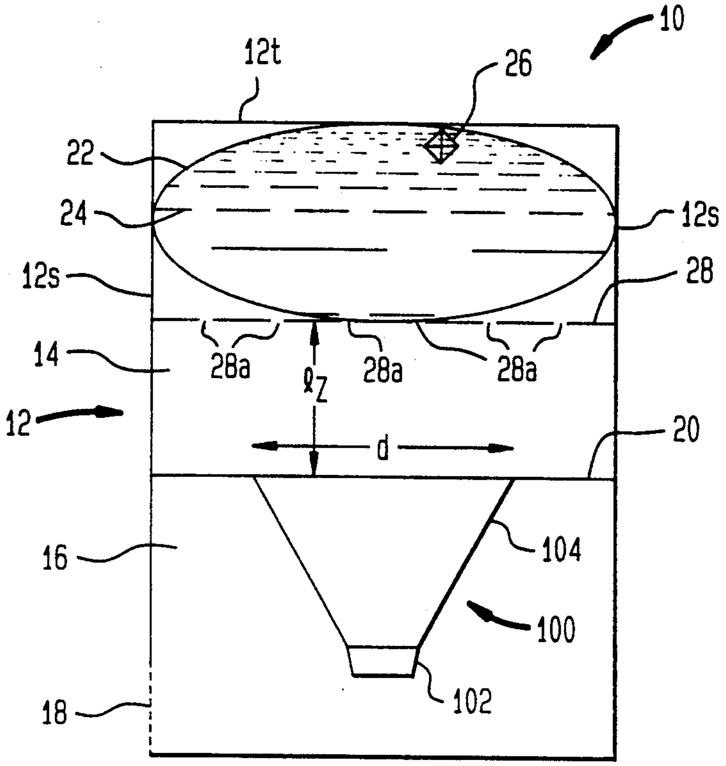
FIG. 1(*a*) is a schematic view of the acoustic enclosure system according to a preferred embodiment of the present invention.
Figure 1B:
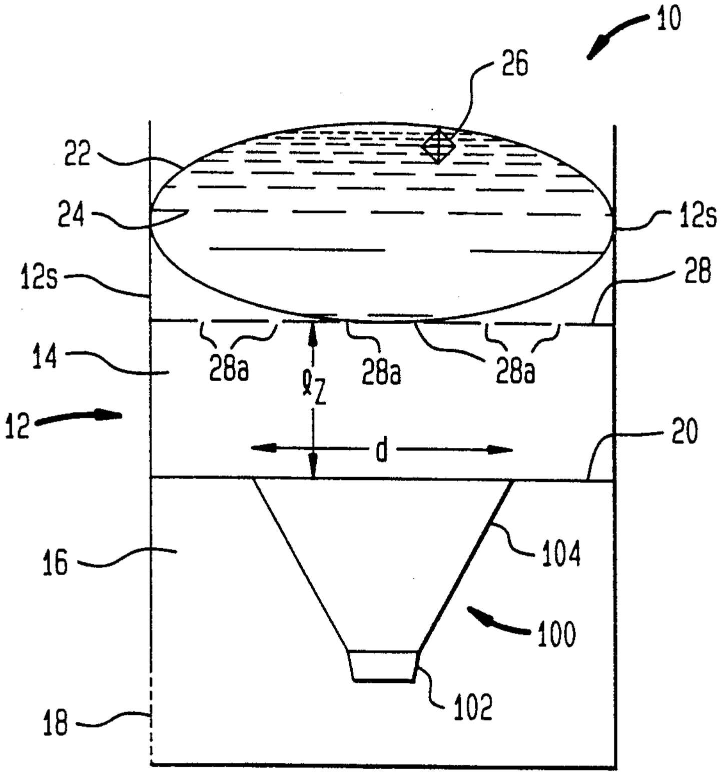

Referring now to the drawings, and more particularly to FIG. 1(*a*), a schematic view is shown of an acoustic enclosure system 10 for a loudspeaker 100 according to a preferred embodiment of the present invention. Loudspeaker 100 is a conventional low frequency dynamic loudspeaker or woofer, the choice of which is not a limitation on the present invention. System 10 includes an enclosure 12 having an air-tight upper chamber 14 and a lower chamber 16 having a port 18 that is open to the surrounding environment. Typical of loudspeaker enclosures, the entire enclosure structure is rigidly constructed. Loudspeaker 100 is mounted in a wall 20 that separates and seals upper chamber 14 from lower chamber 16. As shown, loudspeaker 100 is mounted to radiate upward into upper chamber 14.

A flexible bladder 22 is housed in upper chamber 14 a distance $l_z$ above loudspeaker 100. Bladder 22 is filled with a liquid 24 via valve 26. Once filled, bladder 22 may be permanently sealed and installed in upper chamber 14. Alternatively, valve 26 may be a resealable valve and bladder 22 may be removable with respect to upper chamber 14 to facilitate the filling and emptying thereof. Liquid 24 is selected such that it remains in its liquid phase throughout the range of expected operating temperatures of system 100. For most purposes, liquid 24 may be water. However, if operation of system 10 at colder temperatures is required, salt water or water with an antifreeze additive may be appropriate. Conversely, at extremely high temperatures, a water/coolant mixture may be required to prevent boiling. The amount of water or mixture thereof used to fill bladder 22 is approximately equal to one gallon of liquid for every 2″ of loudspeaker diameter d. For example, if loudspeaker 100 has an 18″ diameter, 9 gallons of liquid 24 are required to fill bladder 22.

Bladder 22 is supported and maintained at the height $l_z$ above loudspeaker 100 by a flexible wall 28 that is fixed to and supported at the side walls 12*s* of enclosure 12. To simplify discussion and analysis of the present invention, it will be assumed that flexible wall 28 is generally horizontal such that $l_z$ is substantially constant. It has been found experimentally that $l_z$ is equal to approximately one half of the diameter d of loudspeaker 100. As will be explained further hereinbelow, flexible wall 28 is designed with perforations 28*a* to allow sound pressure generated by loudspeaker 100 to pass therethrough.

As it is filled, bladder 22 expands to substantially fill the chamber defined by top wall 12*t* of enclosure 12, side walls 12*s* of enclosure 12 and flexible wall 28. Once filled, bladder 22 contacts one or more of top wall 12*t* and side walls 12*s*. Since bladder 22 is installed from the top of enclosure 12, top wall 12*t* is generally a removable part of enclosure 12 that may be sealed in place by any conventional means. For purposes to be explained further hereinbelow, certain applications may simultaneously utilize bladder 22 as the top wall of enclosure 12 such that bladder 22 forms an airtight seal with side walls 12*s* so that upper chamber 14 is airtight. Such an alternative embodiment is shown in FIG. 1(*b*). If bladder 22 is to be emptied and filled from time to time, valve 26 may be resealable and extend through and be sealed in one of the side walls 12*s* or through top wall 12*t*.

In operation, the flexible cone 104 of loudspeaker 100 generates sound pressure waves of equal and opposite magnitude into both upper chamber 14 and lower chamber 16. With respect to upper chamber 14, the waves impinge upon and pass through (via perforations 28*a*) flexible wall 28. The underside of bladder 22 receives the waves and transmits same through liquid 24. The waves propagate through liquid 24 and are coupled to side walls 12*s* and, if present, top wall 12*t* wherever bladder 22 is in contact with same. In this way, sound waves are coupled to relatively rigid radiating surfaces, namely, enclosure 12. Simultaneously, a portion of each pressure wave is reflected back towards its source, i.e., speaker 100, causing a reflective damping effect in the area of upper chamber 14 below flexible wall 28 and on cone 104. Additionally, because liquid filled bladder 22, flexible wall 28 and cone 104 are all flexible and compressive in nature, they constitute a complex spring system which tends to oscillate in such a manner as to slightly modulate (or broaden) the excitation frequency. This, coupled with the relatively large mass of the "radiating surfaces" (formed by enclosure 12) combine to provide a "full" sounding low frequency response.

The "full" sounding low frequency response can be described physically and mathematically by examining the resonant frequencies $f_{xyz}$ of an enclosure as given by $$f_{xyz} = \frac{1}{2}\nu\sqrt{\left(\frac{n_x}{l_x}\right)^2 + \left(\frac{n_y}{l_y}\right)^2 + \left(\frac{n_z}{l_z}\right)^2} \quad (1)$$

where $\nu$ is the speed of sound, i.e., approximately 345 m/s; $n_x$, $n_y$, $n_z$ are integers 0, 1, 2, 3, 4, . . . ; and $l_x$, $l_y$, and $l_z$ are the linear dimensions of the enclosure in the x, y and z axes.

Since the strongest force component acting on bladder 22 is in the vertical direction (i.e., force of gravity and upwardly directed soundwaves from loudspeaker 100), it is only necessary to look at resonant frequencies in the vertical or z-axis. Thus, for the case $n_z=1$, $$f_z = \frac{1}{2}\nu\sqrt{\left(\frac{1}{l_z}\right)^2} = \frac{\nu}{2l_z} \quad (2)$$

Once loudspeaker 100 is energized, the dimension $l_z$ oscillates over a small range of distances centered about the dimension $l_z$. Hence, instead of a single point resonant frequency f, the resonant frequency is modulated to provide a small range of resonant frequencies centered about f.

Figure 2:
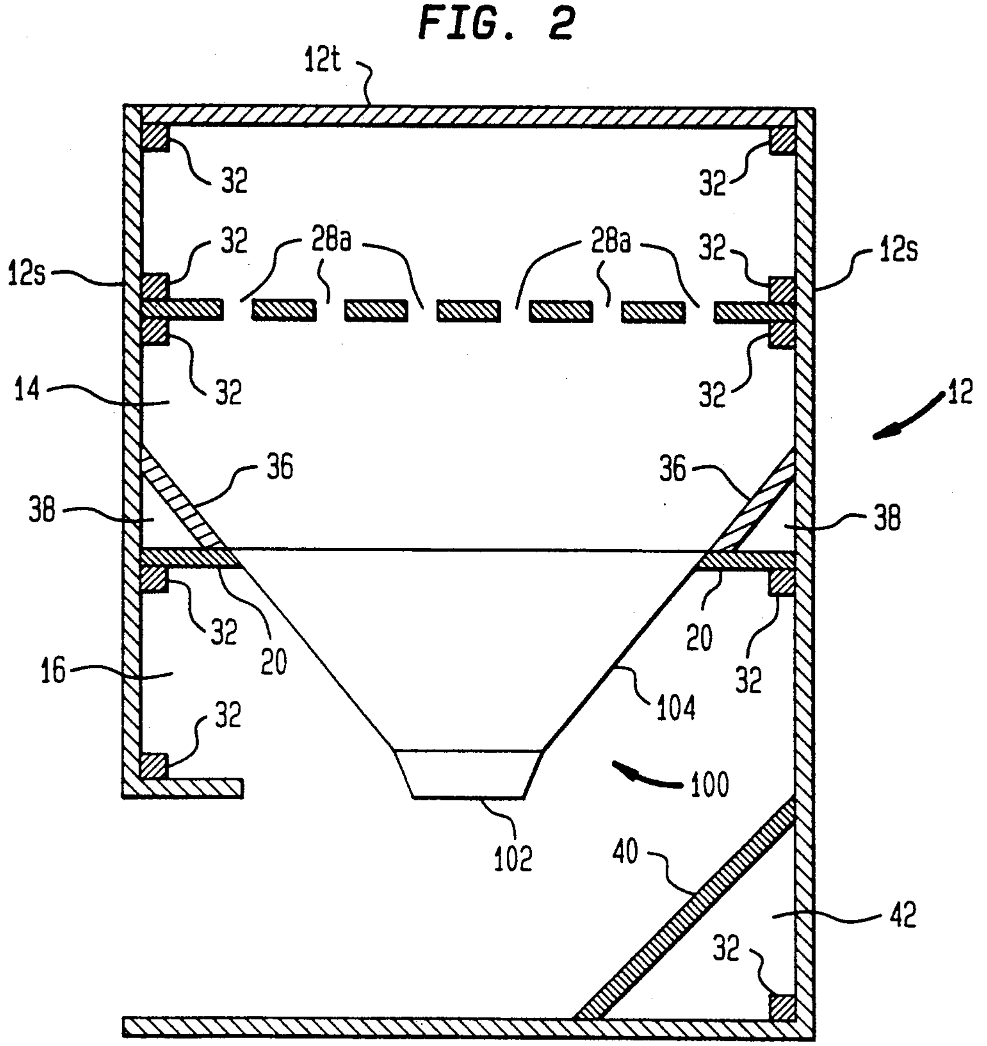
FIG. 2 is a cross-sectional view of a preferred embodiment construction of the enclosure.

It is to be understood that the aforedescribed invention will apply to a variety of enclosure shapes and materials used therefore. For example, enclosure 12 might be cylindrical, rectangular, octagonal, etc. By way of descriptive example, a rectangular enclosure construction based on the schematic of FIG. 1(*a*) is shown in greater detail in FIG. 2 where elements common with FIG. 1(*a*) will be described with common reference numerals. The bladder has been omitted from FIG. 2 for sake of clarity. Enclosure 12 is rigidly constructed from a dense material that is typically screwed and glued together in cooperation with a plurality of battens 32. For best radiating characteristics, the material used to construct enclosure 12 is a laminate such as plywood or a laminated composite.

Figure 3:
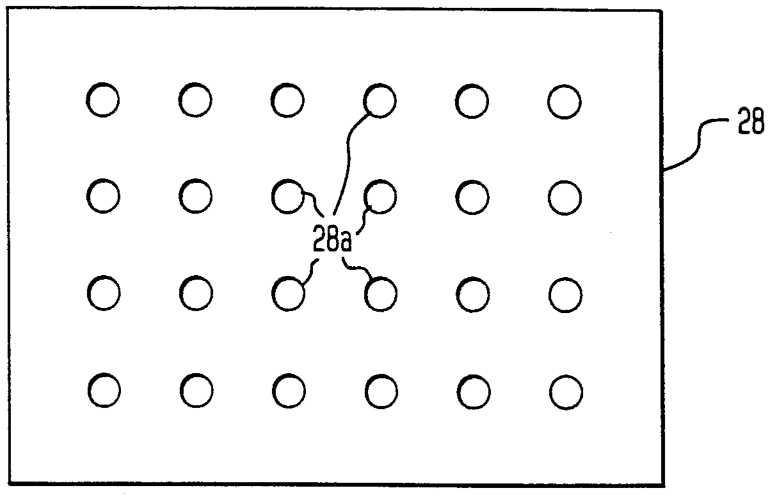
FIG. 3 is a planar view of the one embodiment of the flexible wall of FIG. 2.

Flexible wall 28 is supported by and fixed to sidewalls 12*s* by means of battens 32. Flexible wall 28 must be strong enough to support the fluid-filled bladder and yet flex as part of the complex spring system that includes the fluid-filled bladder and loudspeaker cone 104. Flexible wall 28 may be a material such as a flexible fabric or a wood laminate. One such material that performed suitably was a wood laminate manufactured by Georgia Pacific under the tradename Lionite. As shown in the planar view of FIG. 3, flexible wall 28 is provided with a plurality of circular perforations 28*a* to allow the passage of pressure waves as described above. While, the shape and arrangement of perforations 28*a* should be such that the structural integrity of flexible wall 28 is not jeopardized, the specifics relating to perforations 28*a* and their arrangement are not a limitation on the present invention.

Bladder 22 may be constructed from any flexible, liquid-impermeable material such as polyvinyl or rubber. Dimensions of the bladder are selected such that when the required amount of liquid fills same, portions of the bladder come into contact with side walls 12*s* and top wall 12*t* of enclosure 12 as described above with respect to FIG. 1(*a*). Further, as mentioned above, it may be desirable for certain applications to have bladder 22 serve as the top sealing component of upper chamber 14 as shown in the embodiment of FIG. 1(*b*). In this way, a greater amount of sound vibrational energy may be released since the rigidity of top wall 12*t* tends to damp the output of system 10. While it is true that such damping is appropriate for most room acoustics, large hall acoustics may warrant the release of a greater amount of sound vibrational energy yielded by the embodiment of FIG. 1(*b*). However, it should be noted that the presence of a rigid top wall 12*t* as shown in FIG. 1(*a*) simplifies handling of system 10 since it protects bladder 22.

In order to improve coupling efficiency, upper chamber 14 and lower chamber 16 may include baffling systems to direct low frequency waves generated by loudspeaker 100 so as to eliminate or reduce bass roll-off conditions therein. With respect to upper chamber 14 in the rectangular system 10 shown in FIG. 2, one such simple baffling system that could be employed appears as a generally conical extension 36 of cone 104. Use of conical extension 36 prevents the gathering of low frequency waves in lower corners 38 of upper chamber 14. With respect to lower chamber 16 in the rectangular system 10 shown in FIG. 2, a simple single-plate baffle 40 is shown to prevent gathering of low frequency waves in corner 42.

The advantages of the present invention are numerous. The acoustic enclosure system described herein efficiently reproduces audible and subaudible frequencies from 0–150 Hz. Further, by producing a range of resonant frequencies centered about each point resonant frequency, a full low frequency response is achieved.

Although the invention has been described relative to a specific embodiment thereof, there are numerous variations and modifications that will be readily apparent to those skilled in the art in the light of the above teachings. It is therefore to be understood that, within the scope of the appended claims, the invention may be practiced other than as specifically described.

What is claimed as new and desired to be secured by Letters Patent of the United States is:

1. An acoustic enclosure system for a loudspeaker comprising:

an enclosure defining first and second chambers separated by a common wall in which the loudspeaker is sealably mounted, wherein said first chamber is airtight and said second chamber has a port in a wall thereof communicating with the exterior of said enclosure; and flexible bladder means, filled with a fluid and maintained in said first chamber a given distance from the loudspeaker, for receiving acoustic pressure waves generated by the loudspeaker, said bladder means mechanically coupled to a portion of at least one wall of said first chamber that communicates with the exterior of said enclosure.

2. An acoustic enclosure system as in claim 1 wherein said fluid is selected to remain in the liquid phase throughout an expected range of operating temperatures.

3. An acoustic enclosure system as in claim 1 wherein said fluid includes water.

4. An acoustic enclosure system as in claim 1 wherein said fluid is water.

5. An acoustic enclosure system as in claim 1 wherein the loudspeaker is a low frequency loudspeaker and said bladder means is filled with approximately 1 gallon of fluid for every 2" of diameter measurement of the low frequency loudspeaker.

6. An acoustic enclosure system as in claim 1 wherein said bladder means includes resealable means through which said bladder means can be filled with and emptied of said liquid.

7. An acoustic enclosure system as in claim 1 wherein the loudspeaker is a low frequency loudspeaker and said given distance is approximately equal to one-half of the diameter measurement of the low frequency loudspeaker.

8. An acoustic enclosure system as in claim 1 wherein said given distance is a vertical height.

9. An acoustic enclosure system as in claim 1 wherein the loudspeaker is a low frequency loudspeaker, said common wall is a horizontal wall and said given distance is directed vertically.

10. An acoustic enclosure system as in claim 9 wherein said given distance is approximately equal to one-half the diameter measurement of the low frequency loudspeaker.

11. An acoustic enclosure system as in claim 1 wherein the loudspeaker is a low frequency loudspeaker, said common wall is a horizontal wall and said given distance is directed vertically upward from the low frequency loudspeaker.

12. An acoustic enclosure system as in claim 11 wherein said given distance is approximately equal to one-half the diameter measurement of the low frequency loudspeaker.

13. An acoustic enclosure system as in claim 11 further including means for providing flexible support to said bladder means in said first chamber.

14. An acoustic enclosure system as in claim 13 wherein said flexible support means is constructed to allow said acoustic pressure waves generated by the low frequency loudspeaker to pass therethrough.

15. An acoustic enclosure system as in claim 1 wherein said enclosure defining said first and said second chambers is of laminate construction.

16. An acoustic enclosure system as in claim 1 wherein said enclosure defining said first and said second chambers is constructed from plywood.

17. An acoustic enclosure system for a loudspeaker comprising:

an enclosure defining a first chamber on top of a second chamber, said first and second chambers being separated by a common horizontal wall in which the loudspeaker is sealably mounted, wherein said first chamber is airtight and said second chamber has a port in a wall thereof communicating with the exterior of said enclosure;

flexible bladder means, filled with a fluid and maintained in said first chamber a given distance above the loudspeaker, for receiving acoustic pressure waves generated by the loudspeaker, said bladder means mechanically coupled to a portion of at least one wall of said first chamber that communicates with the exterior of said enclosure; and means for providing flexible support underneath said bladder means, said flexible support means horizontally dividing said first chamber into a third chamber sharing a common top wall with said first chamber and a fourth chamber located between said common horizontal wall and said flexible support means.

18. An acoustic enclosure system as in claim 17 wherein said fluid is selected to remain in the liquid phase throughout an expected range of operating temperatures.

19. An acoustic enclosure system as in claim 17 wherein said fluid includes water.

20. An acoustic enclosure system as in claim 17 wherein said fluid is water.

21. An acoustic enclosure system as in claim 17 wherein the loudspeaker is a low frequency loudspeaker and said bladder means is filled with approximately 1 gallon of fluid for every 2" of diameter measurement of the low frequency loudspeaker.

22. An acoustic enclosure system as in claim 17 wherein said bladder means includes resealable means through which said bladder means can be filled with and emptied of said liquid.

23. An acoustic enclosure system as in claim 17 wherein the loudspeaker is a low frequency loudspeaker and said given distance is approximately equal to one-half of the diameter measurement of the low frequency loudspeaker.

24. An acoustic enclosure system as in claim 17 wherein said flexible support means is constructed to allow said acoustic pressure waves generated by the low frequency loudspeaker to pass therethrough.

25. An acoustic enclosure system as in claim 17 wherein said enclosure defining said first and said second chambers is of laminate construction.

26. An acoustic enclosure system as in claim 17 wherein said enclosure defining said first and said second chambers is constructed from plywood.

27. An acoustic enclosure system as in claim 17 wherein said portion includes said common top wall.

28. An acoustic enclosure system as in claim 17 wherein said portion includes said common top wall and at least one side wall of said third chamber that communicates with the exterior of said enclosure.

29. An acoustic enclosure system as in claim 17 wherein said fourth chamber further includes baffle means for increasing acoustic coupling efficiency between said third and fourth chambers.

30. An acoustic enclosure system as in claim 17 wherein said second chamber includes baffle means for increasing acoustic coupling efficiency between said second chamber and the exterior of said enclosure.

31. An acoustic enclosure system for a low frequency loudspeaker comprising:

a generally rectangular enclosure defining a first generally rectangular chamber on top of a second generally rectangular chamber, said first and second chambers being separated by a common horizontal wall in which the loudspeaker is sealably mounted such that the loudspeaker's cone faces up, wherein said first chamber is airtight and said second chamber has a port in a wall thereof communicating with the exterior of said enclosure, said second chamber further including baffle means mounted in at least a portion of the corners of said second chamber for increasing acoustic coupling efficiency between said second chamber and the exterior of said enclosure;

flexible bladder means, filled with a fluid and maintained in said first chamber a given distance above the loudspeaker, for receiving acoustic pressure waves generated by the loudspeaker, said bladder means mechanically coupled to a portion of at least one wall of said first chamber that communicates with the exterior of said enclosure; and means for providing flexible support underneath said bladder means, said flexible support means horizontally dividing said first chamber into a third chamber sharing a common top wall with said first chamber and a fourth chamber located between said common horizontal wall and said flexible support means, said fourth chamber further including baffle means for increasing acoustic coupling efficiency between said third and fourth chambers.

32. An acoustic enclosure system as in claim 31 wherein said fluid is selected to remain in the liquid phase through an expected range of operating temperatures.

33. An acoustic enclosure system as in claim 31 wherein said fluid includes water.

34. An acoustic enclosure system as in claim 31 wherein said fluid is water.

35. An acoustic enclosure system as in claim 31 wherein the loudspeaker is a low frequency loudspeaker and said bladder means is filled with approximately 1 gallon of fluid for every 2" of diameter measurement of the low frequency loudspeaker.

36. An acoustic enclosure system as in claim 31 wherein said bladder means includes resealable means through which said bladder means can be filled with and emptied of said liquid.

37. An acoustic enclosure system as in claim 31 wherein said given distance is approximately equal to one-half of the diameter measurement of the low frequency loudspeaker.

38. An acoustic enclosure system as in claim 31 wherein said flexible support means is constructed to allow said acoustic pressure waves generated by the low frequency loudspeaker to pass therethrough.

39. An acoustic enclosure system as in claim 31 wherein said enclosure defining said first and said second chambers is of laminate construction.

40. An acoustic enclosure system as in claim 31 wherein said enclosure defining said first and said second chambers is constructed from plywood.

41. An acoustic enclosure system as in claim 31 wherein said fourth chamber's baffle means comprise a generally conically shaped wall extending upward and outward from the loudspeaker's perimeter to side walls of said fourth chamber.

* * * * *